(12) United States Patent
Westphal et al.

(10) Patent No.: US 6,660,371 B1
(45) Date of Patent: Dec. 9, 2003

(54) COMPOSITE MATERIAL COATING AND A METHOD FOR THE PRODUCTION THEREOF

(75) Inventors: Hartmut Westphal, Dermbach/Rhön (DE); Volkmar Sottke, Mülheim (DE)

(73) Assignee: Widia GmbH, Essen (DE)

( * ) Notice: Subject to any disclaimer, the term of this patent is extended or adjusted under 35 U.S.C. 154(b) by 0 days.

(21) Appl. No.: 09/787,324
(22) PCT Filed: Sep. 4, 1999
(86) PCT No.: PCT/DE99/02859
§ 371 (c)(1), (2), (4) Date: Mar. 14, 2001
(87) PCT Pub. No.: WO00/17416
PCT Pub. Date: Mar. 30, 2000

(30) Foreign Application Priority Data

Sep. 24, 1998 (DE) .......................... 198 43 743

(51) Int. Cl.$^7$ .................................. B32B 9/00
(52) U.S. Cl. ................. 428/216; 428/325; 428/336; 428/697; 428/698; 428/701; 428/702
(58) Field of Search .................. 427/255.1, 255.3, 427/255.7; 428/216, 336, 701, 702, 697, 699, 698, 325

(56) References Cited

U.S. PATENT DOCUMENTS 4,180,400 A * 12/1979 Smith et al.
4,714,660 A    12/1987 Gates, Jr.
4,745,010 A     5/1988 Sarin et al.
5,827,570 A * 10/1998 Russell

FOREIGN PATENT DOCUMENTS

| DE | 28 25 009     | 12/1978 |
| DE | 195 18 927 A1 | 1/1996  |
| DE | 195 12 323 A1 | 10/1996 |
| DE | 197 48 461 A1 | 6/1998  |
| EP | 0 162 656 A2  | 11/1985 |
| EP | 0 302 984 A1  | 2/1989  |
| EP | 0 732 423 A1  | 9/1996  |
| EP | 0 786 536 A1  | 7/1997  |
| JP | 62290870      | 12/1987 |

* cited by examiner

*Primary Examiner*—Archene Turner
(74) *Attorney, Agent, or Firm*—Herbert Dubno

(57) ABSTRACT

The invention relates to a composite material comprised of a coated hard metal or cermet base and to a method for the production thereof. The single layer or multilayer coating on the base contains at least one layer with a thickness ranging from 0.5 μm to 25 μm, at least one $Al_2O_3$ phase, and at least one phase comprised of $ZrO_2$ and/or $HfO_2$. According to the invention, a third finely dispersive phase comprised of an oxide, oxicarbide, oxinitride or oxicarbonitride of titanium should be included in this $Al_2O_3/ZrO_2$ layer and/or $HfO_2$ layer. To this end, a CVD process is used at depositing temperatures ranging from 900° C. to 1000° C. in the gas phase under pressures ran from 10 to 100000 Pa, whereby the gas phase, in addition to the gases essential for deposition, contains 0.2 to 5 mol % $TiCl_4$.

8 Claims, 2 Drawing Sheets

1

COMPOSITE MATERIAL COATING AND A METHOD FOR THE PRODUCTION THEREOF

CROSS REFERENCE TO RELATED APPLICATION

Figure 1:
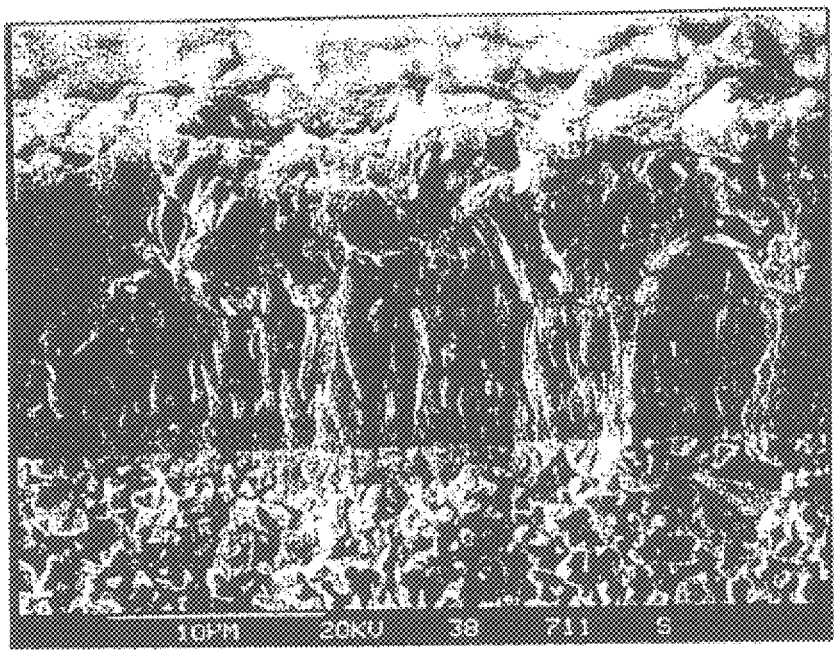

This is a national stage of PCT/DE 99/02859 filed Sep. 4, 1999 based upon a German national application 198 43 743.9 filed Sep. 24, 1998 under the International Convention.

FIELD OF THE INVENTION

The invention relates to a composite material made of a coated hard metal or cermet substrate in which the sole layer or at least one layer of a multiple layer coating with a thickness of 0.5 $\mu$m to 25 $\mu$m, preferably the outermost layer, contains an $Al_2O_3$—phase and a phase consisting of $ZrO_2$ and/or $HfO_2$.

The invention relates further to a method of producing a layer containing a $Al_2O_3$ phase and a phase consisting of $ZrO_2$ and/or $HfO_2$ on a substrate or substrate body coated with one or more layers by means of a CVD (Chemical Vapor Deposition) process at deposition temperatures ranging between 900° C. and 1000° C. in the gas phase which contains the gases necessary for the deposition and selected from the Group $AlCl_3$, $ZrCl_4$, $HfCl_4$, $CO_2$, $H_2$, $CH_4$ and $N_2$ or inert gases, and under pressures of 10 to 100,000 Pa.

BACKGROUND OF THE INVENTION

DE 27 36 982 A1 already describes a wear-resistant layer for preformed parts, particularly tools, consisting of a formed body, preferably of hard metal, and one or more surface coatings, of which at least one protective layer consists of a ceramic matrix in which a further material has been embedded. The ceramic matrix and the embedded material have clearly different heat expansion coefficients, so that the protective layer is pervaded by extremely fine microcracks. As an embedding material in a ceramic matrix of $Al_2O_3$ a destabilized and/or partially stabilized $ZrO_2$ is provided. For the production of such a layer by the CVD process, aluminum trichloride, carbon dioxide and hydrogen for the formation of $Al_2O_3$ are introduced in the gas phase together with zirconium tetrachloride and water vapor for the formation of $ZrO_2$, in a reactor at 1100° C. Due to the density difference between zirconium oxide which is tetragonal above a conversion temperature of 1100° C. and monoclinal below approximately 1100° C., in a corresponding phase conversion a considerable volume modification of the embedded zirconium oxide results. As a consequence, with the increasing percent by volume of the zirconium oxide, the microcrack density in the deposited ceramic layer is increased.

DE 28 25 009 C2 describes a hard metal body with a thin wear-resistant surface layer of aluminum oxide, which consists entirely or at least 85% of κ modification and that a balance consisting optionally of the α-modification is created on the surface areas, e.g. in spots with a size of maximum 10 $\mu$m. In addition, the aluminum oxide layer can contain additions of titanium, zirconium and/or hafnium. For the production of this ceramic layer by means of the CVD process, besides $H_2$, $AlCl_3$, $CO_2$ and $CO$ and also minimal amounts of 0.03 to 0.5% $TiCl_4$ are added to the gas mixture.

This addition, however, serves exclusively or almost exclusively for the formation of the κ-aluminum-oxide phase.

A further CVD process for the deposition of $Al_2O_3$ and/or $ZrO_2$ by using an additional reagent, such as hydrogen sulfide is described in EP 0 523 021 B1.

DE 195 18 927 A1 describes a coated cutting tool with a sintered carbide or ceramic substrate, with a wear-resistant compound ceramic coating, which has two different metal oxide phases, e.g. $Al_2O_3$ and $ZrO_2$, as well as a doping agent selected from the group which consists of sulfur, selenium, tellurium, phosphorus, arsenic, antimony, bismuth or compounds of the mentioned elements. For the production of this two-phase layer according to CVD process, for instance aluminum and zirconium chloride, carbon dioxide with hydrogen as carrier in addition to a $H_2S$ gas are guided over the substrate body at a temperature of approximately 700 to 1250° C. and a pressure of 113 Pa to atmospheric pressure, whereby a two-phase layer is deposited with the doping agent.

OBJECTS OF THE INVENTION

It is the object of the present invention to improve the wear resistance of the composite material mentioned at the outset.

It is another object to provide a composite material which can be used as a cutting insert in machining operations with improved tool life and efficiency.

Further it is the object of the present invention to provide a method for the production of the improved composite material.

SUMMARY OF THE INVENTION

These objects as achieved with the composite material of the invention which is characterized in that in the layer containing $Al_2O_3$ and $ZrO_2$, $HfO_2$ or mixtures thereof, a third finely dispersed phase is embedded, which consists of an oxide, oxycarbide, oxynitride or oxycarbonitride of titanium. Particularly the third phase can consist of $TiO_2$, $TiO$, $Ti_2O$, $Ti_2O_3$, $Ti(O, C)$, $Ti(O, N)$ or $Ti (O, C, N)$ or mixed phases thereof, which in the following are generally referred to as $TiO_x$ phases. The embedding of the $TiO_x$ compounds in the two-phase ceramic layer will advantageously cause a dispersion-enhancing effect in the two-phase ceramic layer, which will considerably improve the wear resistance of this layer.

The hard metal or cermet substrate has a coating of one or more layers of a thickness of 0.5 to 25 $\mu$m with the sole layer or at least one layer, preferably the outermost layer having the third phase.

According to a particular embodiment of the invention, the proportion of this third phase ($TiO_x$) in the total amount of the ceramic layer equals 0.2, preferably 0.6 to 5% by mol, furthermore advantageously 1% by mol. The molar ratio of the $Al_2O_3$ phase to the $ZrO_2$, $HfO_2$ or $ZrO_2/HfO_2$ phase, which can be a mixed oxide (Zr, Hf)$O_2$, is adjusted according to need, i.e. according to the intended use of the composite material. It is generally known that at 1000° C. aluminum oxide has a high hardness a low heat conductivity. The heat generated during the use of the composite material as a cutting tool in machining operations is therefore primarily transmitted to the chip and only to a small extent to the cutting insert, which reduces the danger of plastic deformation of the cutting edge. Aluminum oxide is oxidation-resistant even at high temperatures, the wear declivity with iron materials, as well as the friction coefficient are reduced. However, in the deposition of pure $Al_2O_3$-layers, the problem arises that the grain growth during deposition is hard to control. The $ZrO_2$ or $HfO_2$ which compared to $Al_2O_3$ are even more stable against chemical reactions and also have extremely low friction values with respect to iron materials, are however softer than the $Al_2O_3$, but have the advantage that, in common deposition with $Al_2O_3$, they reduce the crystallite growth of the $Al_2O_3$ phase and also the friction coefficient in the composite material. Furthermore the content of $ZrO_2$ and/or $HfO_2$ in the $Al_2O_3$ layer enhances its heat-insulating effect, since for instance $ZrO_2$ has only 1/10 of the heat conductivity compared to $Al_2O_3$. The respective ratio of the two phases is selected depending on intended use, when the improved chemical inertia, the improved heat insulation of the $ZrO_2$ or $HfO_2$ or the higher wear resistance of $Al_2O_3$ against abrasion have to be put to use. Preferably the ratio of the $Al_2O_3$ phase to the $ZrO_2$, $HfO_2$ or $ZrO_2/HfO_2$ phase ranges between 9/10 and 10/1, whereby the $ZrO_2$ and $HfO_2$ can be present in monoclinal or tetragonal form.

According to a further embodiment of the invention, the third fine-crystalline phase has a size which is smaller than the size of the crystallites of the $Al_2O_3$ and the $ZrO_2$ or phases.

According to a further embodiment of the invention the composite-material coating is multilayered and has at least one layer made of a carbide, nitride or carbonitride of one of the elements of the Groups Iva to Via of the Classification of Elements. Between the substrate body and the outermost layer of $Al_2O_3/ZrO_2$ (optionally substituted entirely or partially by $HfO_2)/TiO_x$, an intermediate layer of TiN and/or Ti(C, N) can be arranged. The layer prevents the relatively brittle ceramic coatings from splitting off the substrate body.

The thickness of the $Al_2O_3/ZrO_2$ or $HfO_2/TiO_x$ layer ranges preferably between 1 $\mu$m and 10 $\mu$m, particularly between 2 $\mu$m and 8$\mu$m. The total thickness of the coating should not surpass 20 $\mu$m.

In a special embodiment, the first layer consisting of a titanium nitride or titanium carbonitride deposited on the substrate body has a thickness between 3 and 8 $\mu$m, and the second layer consisting of $Al_2O_3/ZrO_2$ or $HfO_2/TiO_x$ has a thickness between 2 and 8 $\mu$m, whereby this second layer is either the outer layer or whereby o this second layer an outer coating of TiN, $ZrO_2$ or ZrCN with a thickness between 1 and 5 $\mu$m is applied.

For the production of the aforedescribed $Al_2O_3$—$ZrO_2$ or $HfO_2$—$TiO_x$ layer CVD deposition temperatures between 900° C. and 1000° C. are selected. The temperature should not fall below 900° C. because of the low deposition rate, but the deposition temperature of 1000 C should not be surpassed, since at high temperature, depositions which are too thick occur at the edges of the composite material, which particularly when the composite material is used as a cutting insert lead easily to undesired detachments (scaling). The pressure in the gas atmosphere which is composed of $AlCl_3$, $ZrCl_4$, $HfCl_4$, $CO_2$, $H_2$ $CH_4$ and $N_2$ or inert gases, ranges between 10 to 100,000 Pa. According to the invention, the gas phase contains 0.2 to 5% by mol $TiCl_4$. With the exception of the content of titanium chloride in the gas phase according to the invention, the CVD process is basically known to the state of the art, for instance from the previously mentioned DE 195 18 927 A1.

According to a further embodiment of the invention, the gas content of $AlCl_3$ equals 1 to 5% by mol and/or the gas content of $ZrCl_4$ or $HfCl_4$ equals 0.2 to 5% by mol, in order to obtain the desired relative percentage of the $Al_2O_3$ phase to the $ZrO_2$ or $HfO_2$ phase. Preferably the pressure of the gas phase is below 100,000 Pa, particularly around 8000 Pa. For the deposition of a multiple layer coating onto a hard metal substrate body which had a composition of 94% by mol WC the rest Co, a CVD process with a gas phase temperature of 1000° C. was selected. The pressure of the respective gas phase was around 8000 Pa.

The a first example, onto the mentioned layer sequence TiN, Ti(C, N), the described outer layer $Al_2O_3/ZrO_2/TiO_x$ has been applied. The individual layer thicknesses, as well as the gases used can be seen from the following table.

| Individual Layer | Thickness ($\mu$m) | Used Gases |
|---|---|---|
| TiN | 2.0 | $H_2$, $N_2$, $TiCl_4$ |
| Ti(C,N) | 4.1 | $H_2$, $N_2$, $CH_4$, $TiCl_4$ |
| $Al_2O_3/ZrO_2/TiO_x$ | 8.1 | $H_2$, $Co_2$, $AlCl_3$, |
|  |  | $TiCl_4$, $CH_4$, $ZrCl_4$, $N_2$ |
| Total Thickness | 14.2 |  |

Figure 2:
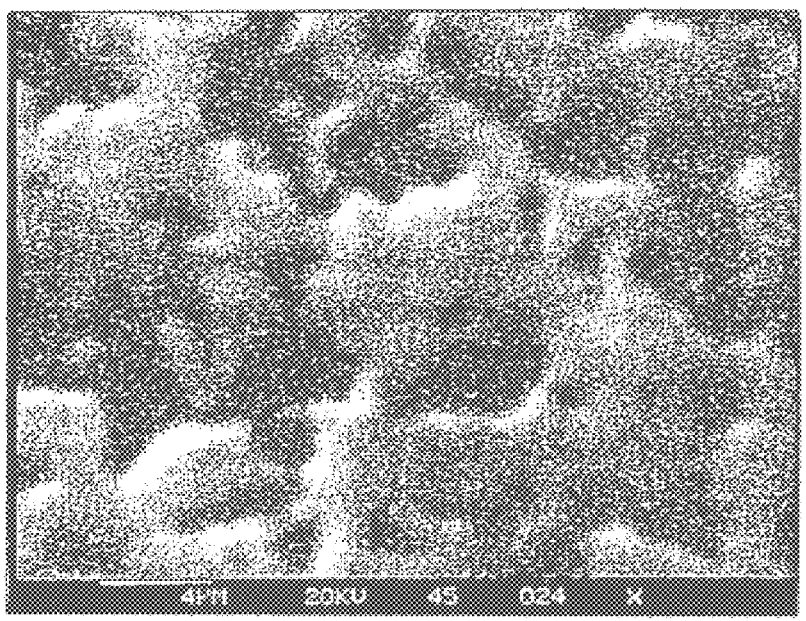

The total gas phase composition during the deposition of the outer layer consisted of 101 $AlCl_3$, 2.51 $ZrCl_4$, 1.61 $TiCl_4$, 201$CO_2$, 401$N_2$, 3201$H_2$ and 151$CH_4$. The layer structure can be seen in FIG. 1, which shows a REM fracture photograph. As can be seen particularly from the enlarged REM structure Photograph of the outer layer according to FIG. 2, the outer layer has $Al_2O_3$ parts appearing as dark phases, $ZrO_2$ parts appearing as light phases as well as $TiO_x$ parts visible as white dots. This phase has a crystallite size which is less than 1/100 of the crystallite size of the other two phases of $Al_2O_3$ and $ZrO_2$.

Comparatively on a substrate body also having the composition WC 94 mol-% and Co 6 mol-% the following layer sequence was applied.

| Individual Layer | Thickness ($\mu$m) | Used Gases |
|---|---|---|
| TiN | 2.0 | $H_2$, $N_2$, $TiCl_4$ |
| Ti(C,N) | 4.0 | $H_2$, $N_2$, $CH_4$, $TiCl_4$ |
| $Al_2O_3$ | 7.6 | $H_2$, $Co_2$, $AlCl_3$ |
| Total Thickness | 13.6 |  |

Such a layer sequence with an outer layer of $Al_2O_3$ is known to the state of the art. Such composite bodies in the form of indexable inserts with a SNUN120412 geometry corresponding to the layer composition of the above Tables have been used for the machining of a shaft of gray cast iron of the type GG25 under the following cutting conditions:

| Cutting speed | vc = 400 m/min |
|---|---|
| Cutting depth | ap = 2.5 mm |
| Advance | fz = 0.31 mm/rotation |
| Wear | VB = 0.5 mm |

With the indexable inserts known to the state of the art, which have an $Al_2O_3$ outer layer, a tool life of approximately 4 minutes could be reached as an average. By comparison, the indexable inserts coated according to the invention with an outer layer of $Al_2O_3/ZrO_2$ achieved under the above conditions of a tool life of 13.7 minutes. This means that the indexable inserts have a considerably improved wear resistance.

In a further application example, indexable inserts with a state of the art coating and indexable inserts with a coating according to the invention were used for milling. The cutting inserts had a RDMW1605 geometry. Here too a hard metal body with 94 mol % WC and 6 mol % Co served as a substrate body. The individual layers know to the state of the art were present as follows:

| Individual Layer | Thickness ($\mu$m) | Used Gases |
|---|---|---|
| TiN | 1.5 | $H_2$, $N_2$, $TiCl_4$ |
| Ti(C,N) | 2.8 | $H_2$, $CH_3CN$, $TiCl_4$ |
| $Al_2O_3$ | 2.3 | $H_2$, $Co_2$, $AlCl_3$ |
| Total Thickness | 6.6 | |

The coating of the invention was deposited under a gas phase temperature of 980° C. as follows:

| Individual Layer | Thickness ($\mu$m) | Used Gases |
|---|---|---|
| TiN | 1.2 | $H_2$, $N_2$, $TiCl_4$ |
| Ti(C,N) | 3.0 | $H_2$, $CH_3CN$, $TiCl_4$ |
| $Al_2O_3$/$ZrO_2$/$TiO_x$ | 2.6 | $H_2$, $Co_2$, $AlCl_3$, $TiCl_4$ |
| | | $CH_4$, $N_2$, $ZrCl_4$ |
| Total Thickness | 6.8 | |

Here additional $N_2$ in an amount of 20 l has been introduced into the gas phase. The produced series of indexable inserts in an embodiment according to the state of the art with an outer $Al_2O_3$ coating as well as a series of the indexable inserts with the coating according to the invention were used for the face milling of a workpiece of a 56NiCr-MoV7 material with tensile strength of 1300 N/mm² under the following cutting conditions.

| Cutting speed | vc = 315 m/min |
|---|---|
| Cutting depth | ap = 0.5 mm |
| Contact Width | ae = 67.2 |
| Advance | fz = 0.31 mm/tooth |
| Wear | VB = 0.3 mm |

The running length per cutting edge of the in cutting inserts of the state of the art amounted to an average of 4000 mm, while the cutting insert according to the invention reached an average running length of 13000 mm. Here too a wear resistance which is more than tripled can be seen.

Instead of the hard metal substrate bodies it is also possible to use cermets of known composition. Also for special applications, it is possible to apply an additional cover layer of ZrCN, HfCN and/or $ZrO_2$, $HfO_2$ or TiN onto the ceramic outer layer of the invention.

In a further application example, indexable inserts with the coating of the invention and indexable inserts with a state of the art coating were used for milling. The cutting inserts had a RDMW1605 geometry. Here too, the substrate body was a hard metal body with 94 mol % WC and 6 mol % Co. The individual layers known to the state of the art were present as follows:

| Individual Layer | Thickness ($\mu$m) | Used Gases |
|---|---|---|
| TiN | 1.5 | $H_2$, $N_2$, $TiCl_4$ |
| Ti(C,N) | 4.8 | $H_2$, $CH_3CN$, $TiCl_4$ |

-continued

| Individual Layer | Thickness ($\mu$m) | Used Gases |
|---|---|---|
| $Al_2O_3$ | 5.3 | $H_2$, $Co_2$, $AlCl_3$ |
| Total Thickness | 11.4 | |

The coating of the invention was deposited under a gas phase temperature of 980° C. as follows:

| Separate Layer | Thickness ($\mu$m) | Used Gases |
|---|---|---|
| TiN | 1.2 | $H_2$, $N_2$, $TiCl_4$ |
| Ti(C,N) | 4.8 | $H_2$, $CH_3CN$, $TiCl_4$ |
| $Al_2O_3$/$HfO_2$/$TiO_x$ | 6.0 | $H_2$, $Co_2$, $AlCl_3$, |
| | | $TiCl_4$, $CH_4$, $HfCl_4$ |
| Total Thickness | 12.0 | |

The series of indexable inserts produced according to the state of the art with an outer $Al_2O_3$ layer, as well as a series of indexable inserts with the coating of the intention were used for the face milling of a workpiece of a GG25 material (HB=180–240) under the following cutting conditions:

| Cutting speed | vc = 570 m/min |
|---|---|
| Cutting depth | ap = 2.0 |
| Contact Width | ae = 62.5 mm |
| Advance | fz = 0.20 mm/tooth |
| Wear | VB = 0.3 mm |

The running length per cutting edge of the cutting inserts known to the state of the art amounted to an average of 5000 mm, while the cutting inserts of the invention reached an average running length of 15000 mm. Here too a three times higher wear resistance can be seen.

In a further application example indexable inserts with a coating known to the state of the art and with a coating according to the invention were used for milling. The cutting inserts had a RDMW1605 geometry. As a substrate body served also a hard metal body with a 94 mol % WC and 6 mol % Co. The layers known to the state of the art were present as follows:

| Individual Layer | Thickness ($\mu$m) | Used Gases |
|---|---|---|
| TiN | 1.0 | $H_2$, $N_2$, $TiCl_4$ |
| Ti(C,N) | 4.9 | $H_2$, $CH_3CN$, $TiCl_4$ |
| $Al_2O_3$ | 6.3 | $H_2$, $Co_2$, $AlCl_3$ |
| Total Thickness | 12.2 | |

The coating of the invention was deposited in a gas phase temperature of 980° C. as follows:

| Individual Layer | Thickness ($\mu$m) | Used Gases |
|---|---|---|
| TiN | 1.5 | $H_2$, $N_2$, $TiCl_4$ |
| Ti(C,N) | 4.1 | $H_2$, $CH_3CN$, $TiCl_4$ |

-continued

| Individual Layer | Thickness (μm) | Used Gases |
|---|---|---|
| $Al_2O_3$/(Zr, Hf)$O_2$/TiO$_x$ | 7.0 | $H_2$, $Co_2$, $AlCl_3$, $TiCl_4$ |
| | | $CH_4$, $N_2$, $ZrCl_4$, $HfCl_4$ |
| Total Thickness | 12.6 | |

The series of indexable inserts produced according to an embodiment known to the state of the art with an outer $Al_2O_3$ coating, as well as a series of indexable insert with the coating of the invention were used for the face milling of a workpiece of a GG70 material (HB=250–300) under the following cutting conditions:

| | |
|---|---|
| cutting speed | vc = 350 m/min |
| cutting depth | ap = 2.0 |
| Contact Width | ae = 25.0 mm |
| Advance | fz = 0.25 mm/tooth |
| Wear | VB = 0.5 |

The running length which can be reached with the cutting inserts known to the state of the art averages 1500 mm per cutting edge, while the cutting inserts of the invention reach an average running length of 4000 mm.

As far as the composite bodies are made into cutting inserts, the latter are suitable for turning, milling, particularly for high-speed milling machines.

We claim:

1. A composite material in the form of a substrate body selected from the group which consists of hard metal and cermet having a coating formed by at least one layer and having a coating thickness of 0.5 μm to 25 μm, the coating including a three-phase layer containing an $Al_2O_3$ phase and a second phase selected from the group which consists of $ZrO_2$, $HfO_2$ and mixtures of $ZrO_2$ and $HfO_2$, and a third finely dispersed phase embedded in said three-phase layer consisting of at least one compound selected from the group which consists of an oxide, oxycarbide, oxynitride and oxycarbonitride of titanium, and the third finely dispersed phase consisting of individual crystallites of a size which is smaller than 1/100 of the crystallite size of the $Al_2O_3$ phase and the second phase.

2. The composite material according to claim 1 wherein third phase consists of $TiO_2$, TiO, $Ti_2O$, $Ti_2O_3$, Ti(O, C), Ti(O, N) or Ti(O, C, N) or mixed phases thereof.

3. The composite material according to claim 2 wherein a molar percent ratio of the third phase in relation to the total amount of said at least one layer is 0.2 to 0.6 to and the mol ratio of the $Al_2O_3$ phase to the second phase lies between 9/10 and 10/1, whereby the second phase consists of at least one of the compounds $ZrO_2$, $HfO_2$ present in a monoclinic or tetragonal form.

4. The composite material defined in claim 3 wherein the molar percent ratio of the third phase in said layer containing said third phase is at least one mole %.

5. The composite material according to claim 3 wherein the coating is multilayered and contains at least one other layer consisting of a carbide, nitride, carbonitride or of an element of the Groups IVa to VIa of the classification of elements.

6. The composite material according to claim 5 wherein a first layer deposited on the substrate body has a thickness between 3 μm and 8 μm and a second layer consisting of $Al_2O_3$/ZrO or $HfO_2$/TiO$_x$ has a thickness between 2 μm and 8 μ, whereby this second layer is either the outer layer or whereby on this second layer an outer coating of TiN, ZrO2, $HfO_2$, ZrCN or HfCN with a thickness between 1 μm and 5 μm is deposited.

7. The composite material according to claim 5 characterized in that a layer sequence deposited on the substrate body consists of a layer of TiN or Ti(CiN) and an outer layer of consisting of said three-phase layer wherein the compound of titanium is $TiO_2$, TiO, $Ti_2O$, $Ti_2O_3$, Ti(O, C), Ti(O, N) or Ti(O, C, N) or mixed phases thereof.

8. The composite material according to claim 7 wherein the thickness of the three-phase layer ranges between 1 μm and 10 μm and that the total thickness of the coating does not surpass 25 μm.

* * * * *